(12) United States Patent
Lim et al.

(10) Patent No.: US 10,916,596 B2
(45) Date of Patent: Feb. 9, 2021

(54) DISPLAY CELL, DISPLAY DEVICE, AND METHOD OF MANUFACTURING A DISPLAY CELL

(71) Applicant: SAMSUNG DISPLAY CO., LTD., Yongin-si (KR)

(72) Inventors: Hyungjun Lim, Asan-si (KR); Dong-Yoon So, Asan-si (KR); Kyung Min Park, Cheonan-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 16/793,774

(22) Filed: Feb. 18, 2020

(65) Prior Publication Data

US 2020/0286965 A1    Sep. 10, 2020

(30) Foreign Application Priority Data

Mar. 8, 2019    (KR) .......................... 10-2019-0026804

(51) Int. Cl.
  *H01L 27/32*    (2006.01)
  *H01L 51/56*    (2006.01)
  *H01L 51/00*    (2006.01)

(52) U.S. Cl.
  CPC ...... *H01L 27/3223* (2013.01); *H01L 27/3276* (2013.01); *H01L 51/0031* (2013.01); *H01L 51/56* (2013.01)

(58) Field of Classification Search
  None
  See application file for complete search history.

(56) References Cited

U.S. PATENT DOCUMENTS

| | | | |
|---|---|---|---|
| 6,734,391 B2 | 5/2004 | Jeon | |
| 6,734,925 B1* | 5/2004 | Lee ...................... | G02F 1/1345 349/40 |
| 7,663,395 B2* | 2/2010 | Chang ................. | G02F 1/13454 324/760.01 |
| 9,261,742 B2* | 2/2016 | Lee ....................... | G09G 3/006 |
| 9,541,809 B2* | 1/2017 | Han .................... | G02F 1/13458 |
| 10,446,069 B2* | 10/2019 | Kim .................... | H05K 1/0269 |
| 2014/0138638 A1* | 5/2014 | Bae ..................... | H01L 51/0031 257/40 |

(Continued)

FOREIGN PATENT DOCUMENTS

| | | |
|---|---|---|
| JP | 3871724 | 10/2006 |
| KR | 10-0326356 | 2/2002 |
| KR | 10-2009-0078527 | 7/2009 |

*Primary Examiner* — Lex H Malsawma
(74) *Attorney, Agent, or Firm* — F. Chau & Associates, LLC

(57) ABSTRACT

A display cell includes a signal line electrically connected to a pixel arranged in a display area, a signal pad unit disposed in a peripheral area adjacent to the display area, and including a signal pad electrically connected to the signal line, an inspection pad unit disposed in a turn-on inspection area, and including an inspection pad electrically connected to the signal pad, where the inspection pad is configured to receive a turn-on inspection signal, and a power supply voltage line configured to apply a power supply voltage to the pixel, extending from the inspection pad unit to the peripheral area, and divided into a plurality of sublines by at least one slit pattern in a cut-off area between the peripheral area and the turn-on inspection area.

20 Claims, 8 Drawing Sheets

(56) References Cited

U.S. PATENT DOCUMENTS

| | | | | |
|---|---|---|---|---|
| 2015/0255527 A1* | 9/2015 | Oooka | ................... | G09G 3/006 |
| | | | | 257/88 |
| 2017/0092711 A1* | 3/2017 | Tsai | .................... | H01L 27/3276 |
| 2018/0226467 A1* | 8/2018 | Ka | ...................... | H01L 51/0031 |

* cited by examiner

<COMPARATIVE EXAMPLE>

<EMBODIMENT>

DISPLAY CELL, DISPLAY DEVICE, AND METHOD OF MANUFACTURING A DISPLAY CELL

CROSS-REFERENCE TO RELATED APPLICATION

This application claims priority under 35 U.S.C. § 119 to Korean Patent Application No. 10-2019-0026804, filed on Mar. 8, 2019 in the Korean Intellectual Property Office (KIPO), the disclosure of which is incorporated by reference herein in its entirety.

TECHNICAL FIELD

Some embodiments of the inventive concept relate to display cells, display devices, and methods of manufacturing the display cells.

DISCUSSION OF RELATED ART

Recently, various flat panel display devices have been developed that have reduced weight and volume, as compared to cathode ray tube (CRT) displays. The flat display devices include liquid crystal displays (LCD), field emission displays (FED), plasma display panels (PDP), organic light emitting diode (OLED) displays, inorganic electroluminescence displays, and quantum dot light-emitting diode (QLED or QD-LED) displays.

An OLED display displays an image by using an organic light emitting diode that emits light through recombination between electrons and holes. OLED displays have a fast response speed and are driven with low power consumption.

The OLED display includes an organic light emitting display panel, and the organic light emitting display panel performs an array inspection for checking electrical defects in a display cell state and a turn-on inspection for checking turn-on defects.

After the array inspection and the turn-on inspection, a module process is performed. The module process includes a step of cutting an inspection area of the organic light emitting display panel with inspection pads and inspection circuits formed thereon used for the array inspection and the turn-on inspection, and a step of attaching a polarizing plate, a protective film, and a flexible circuit board with a driving chip mounted thereon to the cut organic light emitting display panel.

SUMMARY

According to some embodiments of the inventive concept, a display cell includes a signal line electrically connected to a pixel arranged in a display area, a signal pad unit disposed in a peripheral area adjacent to the display area, and including a signal pad electrically connected to the signal line, an inspection pad unit disposed in a turn-on inspection area, and including an inspection pad electrically connected to the signal pad, where the inspection pad receives a turn-on inspection signal, and a power supply voltage line for applying a power supply voltage to the pixel, extending from the inspection pad unit to the peripheral area, and divided into a plurality of sublines by at least one slit pattern in a cut-off area between the peripheral area and the turn-on inspection area.

In some embodiments of the inventive concept, the display cell may further include an insulating film exposing the at least one slit pattern and the plurality of sublines in the cut-off area.

In some embodiments of the inventive concept, the insulating film may include an inorganic insulating film disposed over a gate electrode of a transistor included in the pixel, and an organic insulating film disposed over a source electrode and a drain electrode of the transistor.

In some embodiments of the inventive concept, the at least one slit pattern may have a width corresponding to an extending direction of a cutting line and a length corresponding to a direction intersecting the extending direction.

In some embodiments of the inventive concept, the width of the at least one slit pattern may be greater than a pitch of a laser spot used during a cutting process.

In some embodiments of the inventive concept, the plurality of sublines may have a line width corresponding to the extending direction of the cutting line, and the line width is greater than the pitch of the laser spot.

In some embodiments of the inventive concept, a width of the power supply voltage line in the cut-off area may be determined according to a resistivity characteristic of the plurality of sublines.

In some embodiments of the inventive concept, the display cell may further include a turn-on inspection circuit disposed in the turn-on inspection area and electrically connected to the inspection pad unit.

In some embodiments of the inventive concept, the pixel may include an organic light emitting diode, and the power supply voltage line may include at least one of a first power supply voltage line to transmit a first power supply voltage to the organic light emitting diode, and a second power supply voltage line to transmit a second power supply voltage to the organic light emitting diode.

In some embodiments of the inventive concept, the peripheral area may include a first peripheral area in which the signal pad unit is disposed, a second peripheral area adjacent to the first peripheral area, a third peripheral area facing the second peripheral area, and a fourth peripheral area facing the first peripheral area, the first to fourth peripheral areas may surround the display area, and the first power supply voltage line may extend from the inspection pad unit and is disposed in the first peripheral area.

In some embodiments of the inventive concept, the second power supply voltage line may extend from the inspection pad unit and is disposed in the second, third, and fourth peripheral areas.

According to some embodiments of the inventive concept, a display device includes a display cell including a signal line electrically connected to a pixel arranged in a display area, a signal pad unit disposed in a peripheral area adjacent to the display area and including a signal pad electrically connected to the signal line, and a power supply voltage line disposed in the peripheral area to apply a power supply voltage to the pixel and divided into a plurality of sublines in an edge area, and a flexible circuit board bonded to the signal pad unit through an anisotropic conductive film, where a driving integrated circuit for driving the display cell is mounted over the flexible circuit board.

In some embodiments of the inventive concept, the display cell may further include an insulating film exposing the plurality of sublines disposed in the edge area.

In some embodiments of the inventive concept, the insulating film may include an inorganic insulating film disposed over a gate electrode of a transistor included in the pixel, and an organic insulating film disposed over a source electrode and a drain electrode of the transistor.

In some embodiments of the inventive concept, the pixel may include an organic light emitting diode, and the power supply voltage line may include at least one of a first power supply voltage line to transmit a first power supply voltage to the organic light emitting diode, and a second power supply voltage line to transmit a second power supply voltage to the organic light emitting diode.

In some embodiments of the inventive concept, the peripheral area may include a first peripheral area in which the signal pad unit is disposed, a second peripheral area adjacent to the first peripheral area, a third peripheral area facing the second peripheral area, and a fourth peripheral area facing the first peripheral area, the first to fourth peripheral areas may surround the display area, and the first power supply voltage line may extend from the edge area and is disposed in the first peripheral area.

In some embodiments of the inventive concept, the second power supply voltage line may extend from the edge area and is disposed in the second, third, and fourth peripheral areas.

According to some embodiments of the inventive concept, in a method of manufacturing a display cell, a signal line electrically connected to a pixel arranged in a display area is formed, a signal pad disposed in a peripheral area adjacent to the display area and electrically connected to the signal line is formed, an inspection pad disposed in a turn-on inspection area, and electrically connected to the signal pad such that a turn-on inspection signal is applied to the inspection pad is formed, and a power supply voltage line extending from the inspection pad to the peripheral area, and divided into a plurality of sublines by at least one slit pattern in a cut-off area between the peripheral area and the turn-on inspection area is formed.

In some embodiments of the inventive concept, the at least one slit pattern and the plurality of sublines may be exposed by removing an insulating film disposed over the at least one slit pattern and the plurality of sublines in the cut-off area.

In some embodiments of the inventive concept, the at least one slit pattern may have a width of a slit pattern corresponding to an extending direction of a cutting line, the width of the slit pattern may be greater than a pitch of a laser spot used in a cutting process, the plurality of sublines may have a line width corresponding to the extending direction of the cutting line, and the line width may be greater than the pitch of the laser spot.

BRIEF DESCRIPTION OF THE DRAWINGS

The above and other features of the inventive concept will be more fully understood by describing in detail some embodiments thereof with reference to the accompanying drawings.

DETAILED DESCRIPTION OF THE EMBODIMENTS

Figure 1:
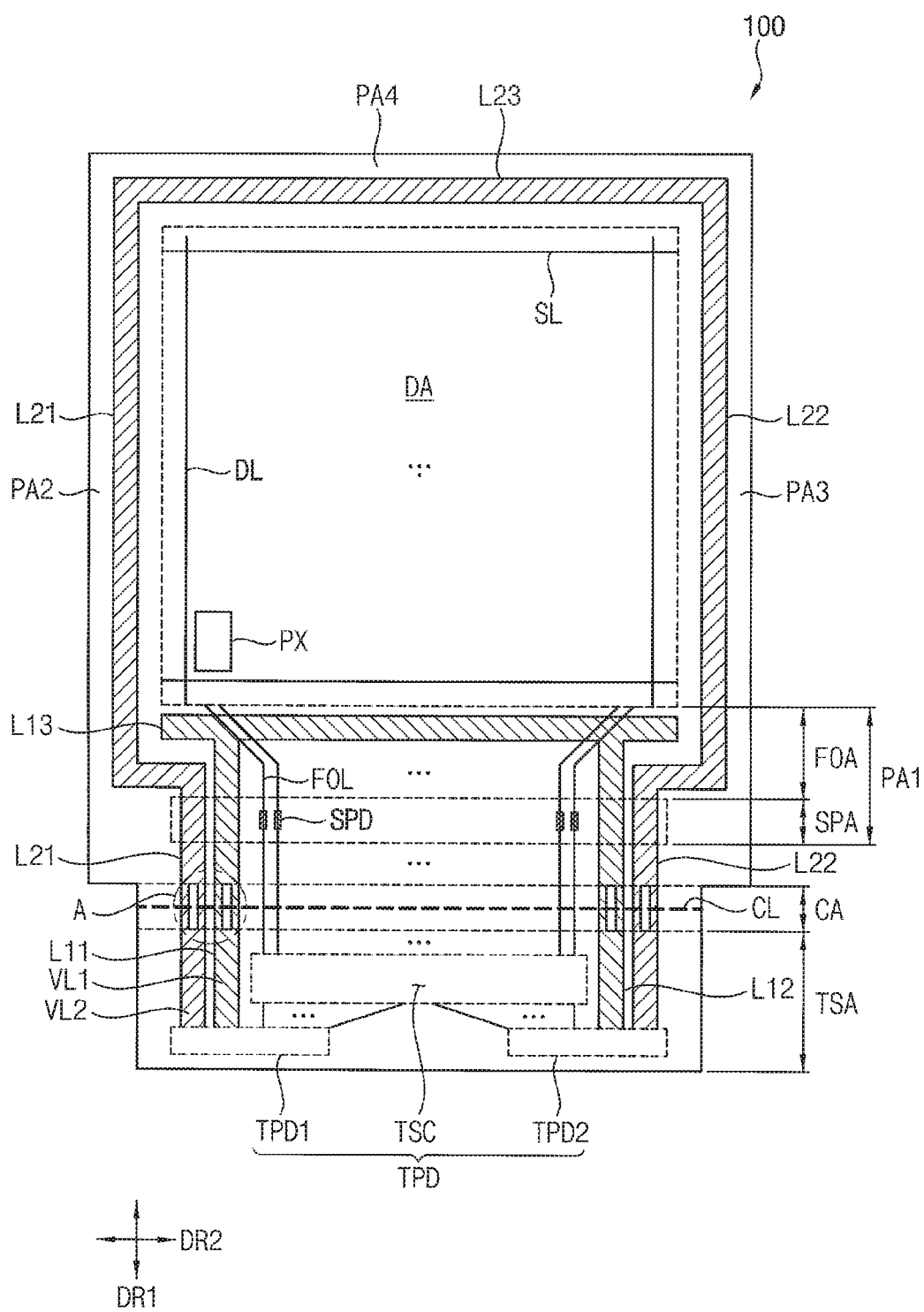
FIG. 1 is a view a plan view for explaining a display cell according to an embodiment of the inventive concept.

Some embodiments of the inventive concept provide a display cell for preventing cracks during a manufacturing process, a display device including the display cell, and a method of manufacturing the display cell.

Hereinafter, some embodiments of the inventive concept will be explained in detail with reference to the accompanying drawings. Like reference numerals may refer to like elements throughout this application.

It will be understood that when an element or layer is referred to as being "on", "over", "connected to" or "coupled to" another element or layer, it can be directly on, over, connected or coupled to the other element or layer or intervening elements or layers may be present. In contrast, when an element is referred to as being "directly on", "directly connected to" or "directly coupled to" another element or layer, there are no intervening elements or layers present.

The terminology used herein is for the purpose of describing particular example embodiments only and is not intended to be limiting of the present inventive concept. As used herein, the singular forms "a", "an" and "the" are intended to include the plural forms as well, unless the context clearly indicates otherwise.

It will be further understood that the terms "comprises", "comprising", "include", "including", "have" and "having", when used in this specification, specify the presence of stated features, integers, steps, operations, elements, and/or components, but do not preclude the presence or addition of one or more other features, integers, steps, operations, elements, components, and/or groups thereof.

Spatially relative terms, such as "beneath", "below", "lower", "under", "above", "over", "upper" and the like, may be used herein for ease of description to describe one element or feature's relationship to another element(s) or feature(s) as illustrated in the figures. It will be understood that such spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. In addition, it will also be understood that when a layer or an element is referred to as being "between" two layers or two elements, it can be the only layer or element between the two layers or elements, or one or more intervening layers or elements may also be present.

Figure 2:
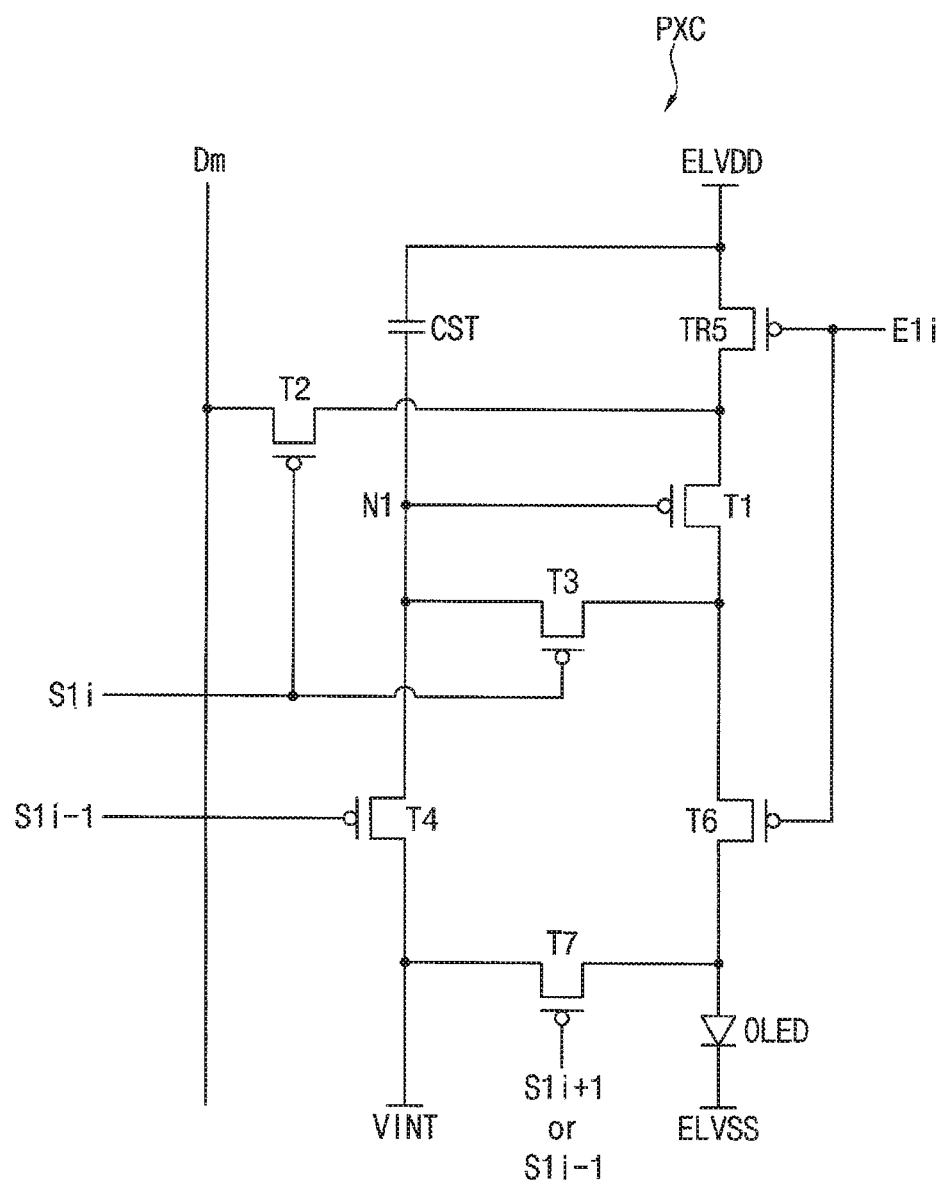
FIG. 2 is a pixel circuit diagram for explaining pixels included in the display cell of FIG. 1 according to an embodiment of the inventive concept.
Figure 3:
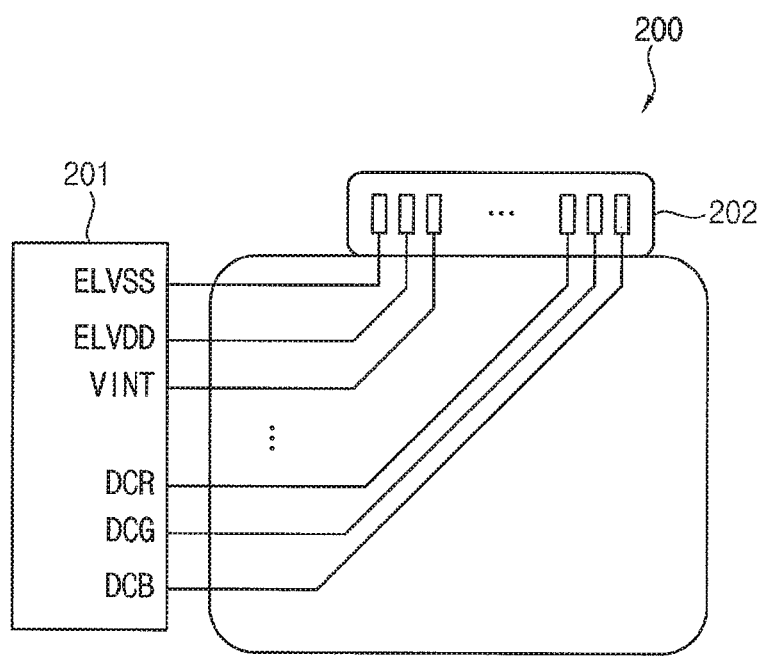
FIG. 3 is a conceptual diagram for explaining a turn-on inspection device for the display cell of FIG. 1 according to an embodiment of the inventive concept.

FIG. 1 is a view a plan view for explaining a display cell according to an embodiment of the inventive concept. FIG. 2 is a pixel circuit diagram for explaining pixels included in the display cell of FIG. 1 according to an embodiment of the inventive concept. FIG. 3 is a conceptual diagram for explaining a turn-on inspection device for the display cell of FIG. 1 according to an embodiment of the inventive concept.

Referring to FIG. 1, a display cell 100 includes pixels PX to display an image, a first power supply voltage line VL1 to transfer a first power supply voltage to the pixels PXs, and a second power supply voltage line VL2 to transfer a second power supply voltage to the pixels PXs.

In an embodiment of the inventive concept, the pixels PXs may include an organic light emitting diode, the first power supply voltage may be a high power supply voltage ELVDD applied to the organic light emitting diode, and the second power supply voltage may be a low power supply voltage ELVSS applied to the organic light emitting diode.

For example, the display cell 100 may include a display area DA with the pixels PX arranged therein, and a non-display area surrounding the display area DA with the first and second power supply voltage lines VL1 and VL2 arranged therein.

The display area DA may include a plurality of pixels P×s arrayed in a matrix form, and a plurality of data lines DLs and a plurality of scan lines SLs electrically connected to the pixels PXs.

The data lines DLs may extend in a first direction DR1, and be arrayed in a second direction DR2 intersecting the first direction DR1.

The scan lines SLs may extend in the second direction DR2, and be arrayed in the first direction DR1.

Referring to FIG. 2, the pixels PXs may include a pixel circuit PXC.

The pixel circuit PXC may include an organic light emitting diode OLED, a first transistor T1, a second transistor T2, a third transistor T3, a fourth transistor T4, a fifth transistor T5, a sixth transistor T6, a seventh transistor T7, and a storage capacitor CST.

An anode of the organic light emitting diode OLED may be electrically connected to the first transistor T1 via the sixth transistor T6, and a cathode may be electrically connected to the second power supply voltage ELVSS. The organic light emitting diode OLED may generate light having luminance corresponding to an amount of current supplied from the first transistor T1.

The first power supply voltage ELVDD may be set to a voltage higher than the second power supply voltage ELVSS, so that a current flows to the organic light emitting diode OLED.

The seventh transistor T7 may be electrically connected between an initialization power supply VINT and the anode of the organic light emitting diode OLED. In addition, a gate electrode of the seventh transistor T7 may be electrically connected to an $(i+1)^{th}$ scan line S1$i$+1 or an $(i-1)^{th}$ scan line S1$i$−1. The seventh transistor T7 may be turned on when a scan signal is supplied to the $(i+1)^{th}$ scan line S1$i$+1 or the $(i-1)^{th}$ scan line S1$i$−1, so that a voltage of the initialization power source VINT may be supplied to the anode of the organic light emitting diode OLED. Herein, the initialization power supply VINT may be set to a voltage lower than a data signal.

The sixth transistor T6 may be electrically connected between the first transistor T1 and the organic light emitting diode OLED. In addition, a gate electrode of the sixth transistor T6 may be electrically connected to an $i^{th}$ light emission control line Eli. The sixth transistor T6 may be turned on when a light emission control signal is supplied to the $i^{th}$ light emission control line Eli.

The fifth transistor T5 may be electrically connected between the first power supply voltage ELVDD and the first transistor T1. In addition, a gate electrode of the fifth transistor T5 may be electrically connected to the $i^{th}$ light emission control line Eli. The fifth transistor T5 may be turned on when the light emission control signal is supplied to the $i^{th}$ light emission control line Eli.

A first electrode of the first transistor T1 (a driving transistor) may be electrically connected to the first power supply voltage ELVDD via the fifth transistor T5, and a second electrode may be electrically connected to the anode of the organic light emitting diode OLED via the sixth transistor T6. In addition, a gate electrode of the first transistor T1 may be electrically connected to a first node N1. In response to a voltage of the first node N1, the first transistor T1 may control an amount of current flowing from the first power source voltage ELVDD to the second power source voltage ELVSS via the organic light emitting diode OLED.

The third transistor T3 may be electrically connected between the second electrode of the first transistor T1 and the first node N1. In addition, a gate electrode of the third transistor T3 may be electrically connected to an $i^{th}$ scan line S1$i$. The third transistor T3 may be turned on when the scan signal is supplied to the $i^{th}$ scan line S1$i$, so that the second electrode of the first transistor T1 may be electrically connected to the first node N1. Accordingly, when the third transistor T3 is turned on, the first transistor T1 may be electrically connected in the form of a diode.

The fourth transistor T4 may be electrically connected between the first node N1 and the initialization power source VINT. In addition, a gate electrode of the fourth transistor T4 may be electrically connected to the $(i-1)^{th}$ scan line S1$i$−1. The fourth transistor T4 may be turned on when the scan signal is supplied to the $(i-1)^{th}$ scan line S1$i$−1, so that the voltage of the initialization power supply VINT may be supplied to the first node N1.

The second transistor T2 may be electrically connected between an $m^{th}$ data line Dm and the first electrode of the first transistor T1. In addition, a gate electrode of the second transistor T2 may be electrically connected to the $i^{th}$ scan line S1$i$. The second transistor T2 may be turned on when the scan signal is supplied to the $i^{th}$ scan line S1$i$, so that the $m^{th}$ data line Dm may be electrically connected to the first electrode of the first transistor T1.

The storage capacitor CST may be electrically connected between the first power supply voltage ELVDD and the first node N1. The storage capacitor CST may store the data signal and a voltage corresponding to a threshold voltage of the first transistor T1.

Referring back to FIG. 1, the non-display area includes a first peripheral area PA1, a second peripheral area PA2, a third peripheral area PA3, and a fourth peripheral area PA4 which surround the display area DA. In addition, the non-display area may include a cut-off area CA adjacent to the first peripheral area PA1 and a turn-on inspection area TSA adjacent to the cut-off area CA.

The first peripheral area PA1 corresponds to a first end of the data line DL and is adjacent to the display area DA. The first peripheral area PA1 may include a fan-out area FOA and a signal pad area SPA.

A fan-out line FOL electrically connected to a signal line such as the data line DL may be arrayed in the fan-out area FOA. A signal pad unit SPD on or over which signal pads electrically connected to the fan-out line FOL are arrayed may be arranged in the signal pad area SPA.

The second peripheral area PA2 corresponds to a first end of the scan line SL and is adjacent to the display area DA.

The third peripheral area PA3 corresponds to a second end of the scan line SL and is adjacent to the display area DA.

The fourth peripheral area PA4 corresponds to a second end of the data line DL and is adjacent to the display area DA.

The cut-off area CA is arranged between the first peripheral area PA1 and the turn-on inspection area TSA. The cut-off area CA is cut along a cutting line CL set through a laser cutting process after a turn-on inspection process and before a module process.

The turn-on inspection area TSA may include a turn-on pad unit TPD arrayed thereon with inspection pads to which inspection signals for performing the turn-on inspection process are applied, and a turn-on inspection circuit TSC electrically connected to the turn-on pad unit TPD. The inspection pads may be electrically connected to the signal pads of the signal pad unit SPD. The turn-on inspection circuit TSC may be electrically connected to the data lines DLs and the scan lines SLs arrayed in the display area DA.

An inspection control signal and an inspection data signal provided from the turn-on pad unit TPD may be applied to the data lines DLs and the scan lines SLs to turn on the pixels PXs, such that the turn-on inspection process may be performed.

In an embodiment of the inventive concept, the turn-on pad unit TPD may be arranged in a laterally symmetrical structure with respect to the display area DA. For example, the turn-on pad unit TPD may include a first inspection pad unit TPD1 corresponding to the second peripheral area PA2, and a second inspection pad unit TPD2 corresponding to the third peripheral area PA3.

Referring to FIG. 3, a turn-on inspection device 200 may include an inspection control unit 201 and an inspection signal output unit 202.

The inspection control unit 201 may generate a plurality of inspection signals corresponding to inspection modes. For example, the inspection signals may include the first power supply voltage ELVDD, the second power supply voltage ELVSS, the initialization voltage VINT, and a plurality of inspection data signals DCR, DCG, and DCB.

The inspection signal output unit 202 may be electrically connected to the turn-on pad unit TPD of the display cell, and provide the inspection signals to the turn-on pad unit TPD.

Referring back to FIG. 1, in an embodiment of the inventive concept, the first power supply voltage line VL1 may include a first voltage line L11, a second voltage line L12, and a third voltage line L13.

The first voltage line L11 is electrically connected to the first inspection pad unit TPD1 and extends along the first direction DR1 from the turn-on inspection area TSA to the signal pad area SPA of the first peripheral area PA1 via the cut-out area CA.

The second voltage line L12 is electrically connected to the second inspection pad unit TPD2 and extends along the first direction DR1 from the turn-on inspection area TSA to the signal pad area SPA of the first peripheral area PA1 via the cut-out area CA.

The third voltage line L13 extends in the second direction DR2 from the fan-out area FOA of the first peripheral area PA1 and is electrically connected to the first and second voltage lines L11 and L12.

In an embodiment of the inventive concept, the second power supply voltage line VL2 may include a first voltage line L21, a second voltage line L22, and a third voltage line L23.

The first voltage line L21 is electrically connected to the first inspection pad unit TPD1, extends along the first direction DR1 from the turn-on inspection area TSA to the signal pad area SPA and the fan-out area of the first peripheral area PA1 via the cut-out area CA, and continuously extends along the first direction DR1 in the second peripheral area PA2.

The second voltage line L22 is electrically connected to the second inspection pad unit TPD2, extends along the first direction DR1 from the turn-on inspection area TSA to the signal pad area SPA and the fan-out area of the first peripheral area PA1 via the cut-out area CA, and continuously extends along the first direction DR1 in the third peripheral area PA3.

The third voltage line L23 extends along the second direction DR2 in the fourth peripheral area PA4, and is electrically connected to the first and second voltage lines L21 and L22.

In an embodiment of the inventive concept, in the cut-off area CA, at least one of the first power supply voltage line VL1 and the second power supply voltage line VL2 may be branched or divided into a plurality of sublines by at least one slit pattern. The at least one slit pattern may have a length corresponding to the direction intersecting the extending direction of the cutting line CL, and have a width corresponding to the extending direction of the cutting line CL. The sublines may be arrayed in the extending direction of the cutting line CL.

The total maximum current capacity for driving the organic light emitting diodes included in the pixels PXs is a level of several tens of amperes, and the current capacity with respect to the power supply voltage may increase as the size of the organic light emitting display increases. Accordingly, the widths of the first power supply voltage line VL1 and the second power supply voltage line VL2 may increase. When the width of a metal line increases, defects such as cracks may occur in the display cell during the laser cutting process due to incomplete laser processing.

According to an embodiment of the inventive concept, to prevent defects such as cracks which may occur in the cutting process, in the cut-off area CA, at least one of the first power supply voltage line VL1 and the second power supply voltage line VL2 may be divided into a plurality of sublines by at least one slit pattern. The width of the slit pattern may be set in consideration of a pitch of a laser spot.

Figure 4:
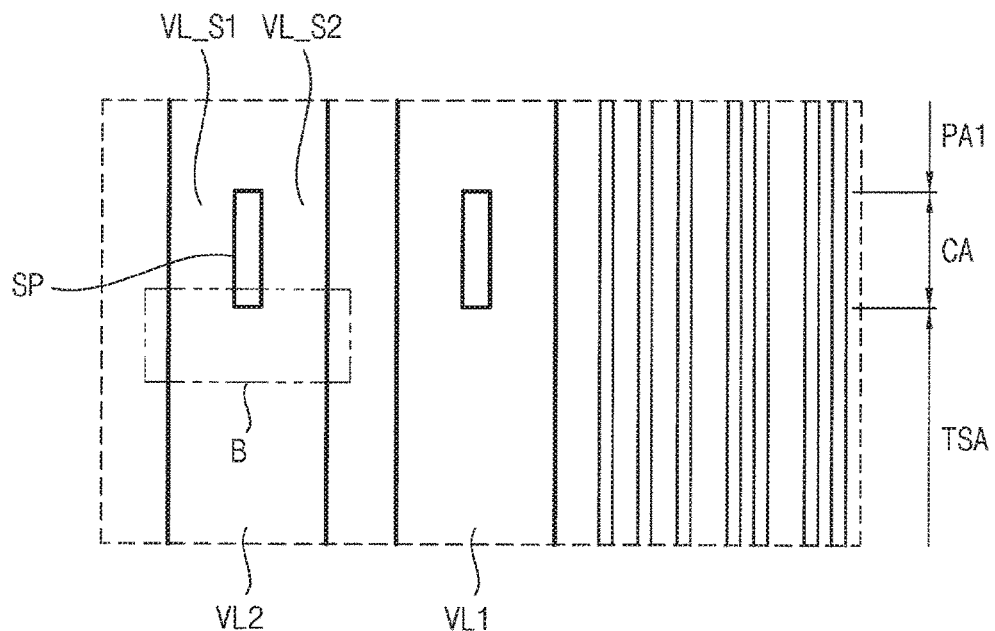
FIG. 4 is an enlarged view of a portion 'A' of FIG. 1 to explain a structure of a power supply voltage line according to an embodiment of the inventive concept.
Figure 5:
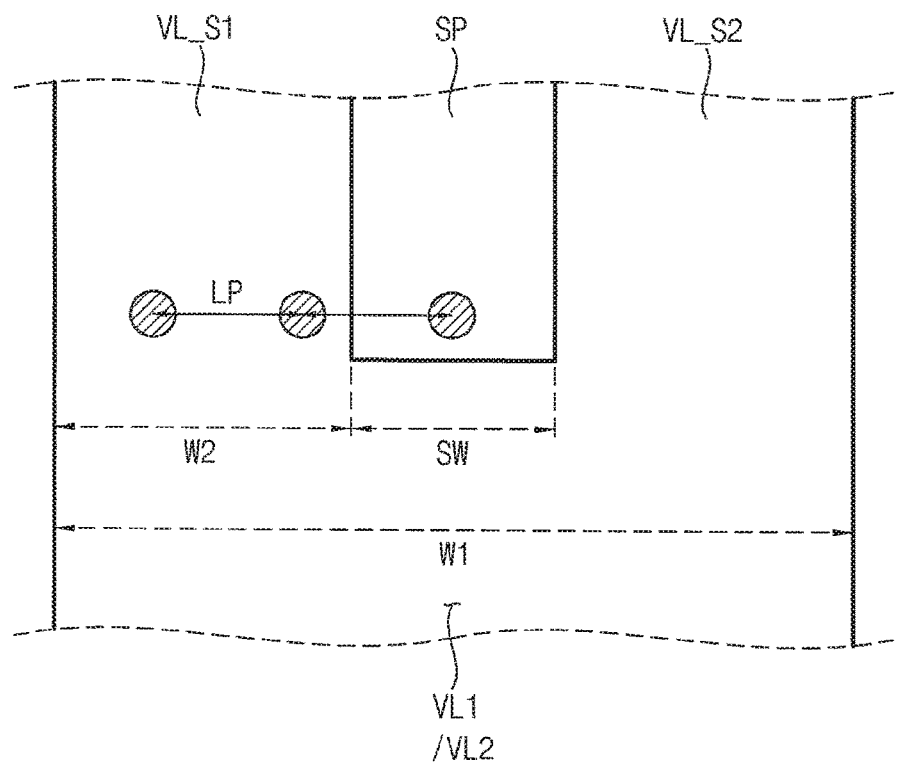
FIG. 5 is an enlarged view of a portion 'B' of FIG. 4 for explaining a slit pattern and a subline in a cut-off area according to an embodiment of the inventive concept.

FIG. 4 is an enlarged view of a portion 'A' of FIG. 1 to explain a structure of a power supply voltage line according to an embodiment of the inventive concept. FIG. 5 is an enlarged view of a portion 'B' of FIG. 4 for explaining a slit pattern and a subline in a cut-off area according to an embodiment of the inventive concept.

Referring to FIGS. 4 and 5, the first power supply voltage line VL1 may transmit the first power supply voltage ELVDD, and the second power supply voltage line VL2 may transmit the second power supply voltage ELVSS.

At least one of the first and second power supply voltage lines VL1 and VL2 may include at least one slit pattern SP in the cut-off area CA.

As shown in the drawing, the first power supply voltage line VL1 has a first width W1 in the turn-on inspection area TSA and the first peripheral area PA1, and includes the slit pattern SP in the cut-off area CA between the turn-on inspection area TSA and the first peripheral area PA1. In the cut-off area CA, the first power supply voltage line VL1 may be divided into a first subline VL_S1 and a second sub line VL_S2 by the slit pattern SP. Each of the first and second sublines VL_S1 and VL_S2 may have a second width W2 smaller than the first width W1.

In addition, the second power supply voltage line VL2 may have the first width W1 in the turn-on inspection area TSA and the first peripheral area PA1, and include the slit pattern SP in the cut-off area CA between the turn-on inspection area TSA and the first peripheral area PA1. In the cut-off area CA, the second power supply voltage line VL2 may be divided into the first subline VL_S1 and the second sub line VL_S2 by the slit pattern SP. Each of the first and second sublines VL_S1 and VL_S2 may have a second width W2 smaller than the first width W1.

In an embodiment of the inventive concept, a width SW of the slit pattern SP may be set to be greater than or equal to a pitch LP of the laser spot used in the laser cutting process (SW≥LP).

In an embodiment of the inventive concept, the second width W2 of the subline may be set to be greater than or equal to the pitch LP of the laser spot (W2≥LP).

Figure 6:
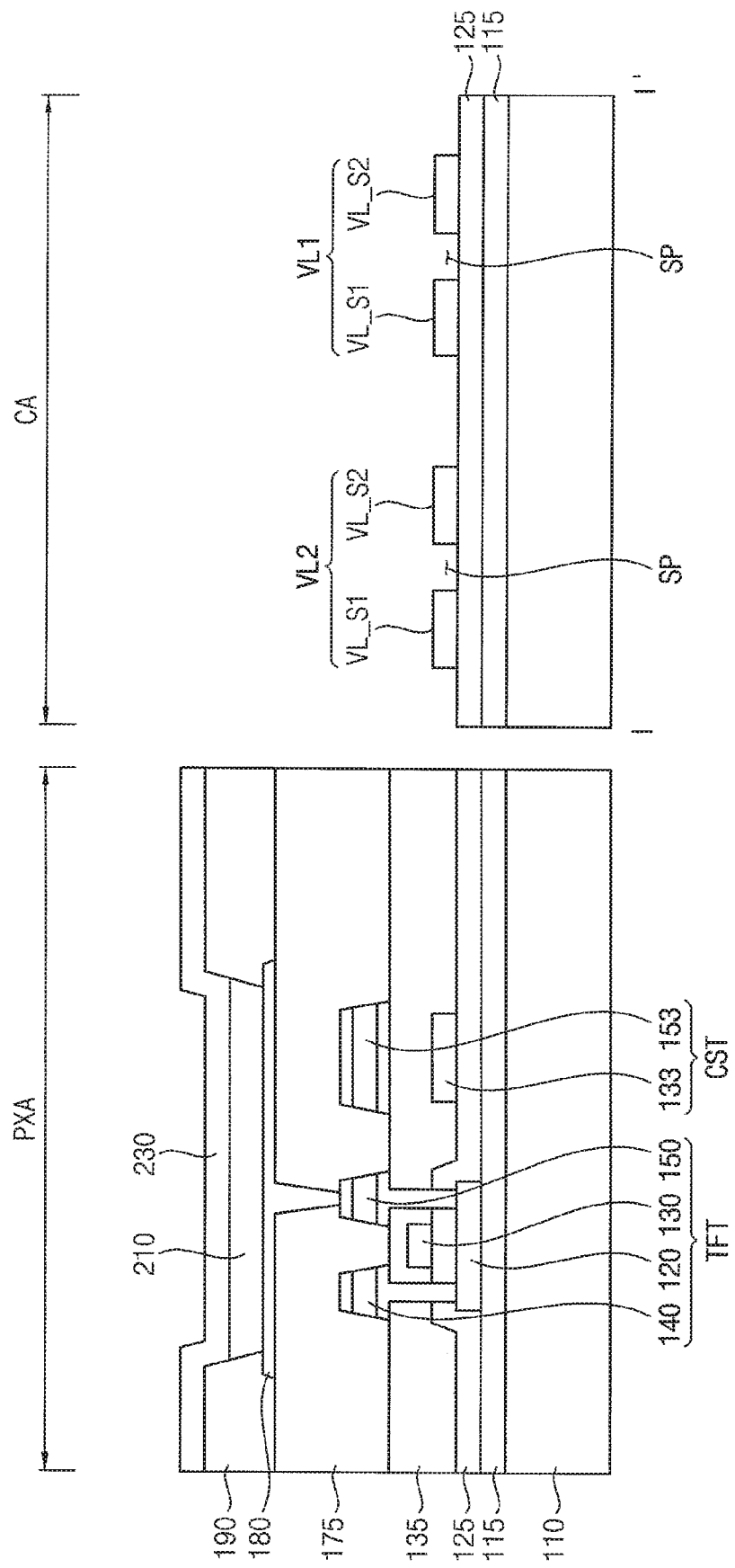
FIG. 6 is a cross-sectional view of the display cell of FIG. 1 according to an embodiment of the inventive concept.

FIG. 6 is a cross-sectional view of the display cell of FIG. 1 according to an embodiment of the inventive concept.

Referring to FIGS. 1, 4 and 6, the display cell may include a pixel area PXA with pixels formed therein and the cut-off area CA cut through the laser cutting process.

The display cell may include a substrate 110, and the substrate 110 may include the pixel area PXA and the cut-off area CA.

The substrate 110 may be a transparent or opaque insulation substrate. For example, the substrate 110 may include glass or plastic such as polyimide (PI), polycarbonate (PC), polyethersulfone (PES), polyethylene terephthalate (PET), or polyacrylate.

Referring to the display cell of the pixel area PXA, a buffer layer 115 may be arranged on or over the substrate 110. The buffer layer 115 may block impurities such as oxygen and moisture permeating through the substrate 110. In addition, the buffer layer 115 may provide a flat surface onto the top of the substrate 110. The buffer layer 115 may include silicon nitride, silicon oxide, silicon oxynitride, or the like. Selectively, the buffer layer 115 may be omitted.

A thin film transistor TFT and a storage capacitor CST (e.g., the storage capacitor CST of FIG. 2) may be arranged on or over the buffer layer 115. The thin film transistor TFT may include a semiconductor layer 120, a gate electrode 130, a source electrode 140, and a drain electrode 150. In an embodiment of the inventive concept, the thin film transistor (TFT) may have a top-gate structure in which the gate electrode 130 is located above the semiconductor layer 120. However, the inventive concept is not limited thereto. In an embodiment of the inventive concept, the thin film transistor (TFT) may have a bottom-gate structure in which the gate electrode 130 is located under the semiconductor layer 120.

The semiconductor layer 120 may be disposed on or over the buffer layer 115. The semiconductor layer 120 may be formed of amorphous silicon, polycrystalline silicon, oxide semiconductor, or the like. The semiconductor layer 120 may include a source area, a drain area, and a channel area formed therebetween.

A gate insulating film 125 covering the semiconductor layer 120 may be disposed on or over the buffer layer 115. The gate insulating film 125 may isolate the gate electrode 130 from the semiconductor layer 120. The gate insulating film 125 may include silicon nitride, silicon oxide, silicon oxynitride, or the like.

The gate electrode 130 may be disposed on or over the gate insulating film 125. The gate electrode 130 may overlap the channel area of the semiconductor layer 120. The gate electrode 130 may be formed of a first metal layer. The first metal layer may include a metal such as molybdenum (Mo), aluminum (Al), copper (Cu), or an alloy thereof.

An interlayer insulating film 135 covering the gate electrode 130 may be disposed on or over the gate insulating film 125. The interlayer insulating film 135 may isolate the source electrode 140 and the drain electrode 150 from the gate electrode 130. The interlayer insulating film 135 may include silicon nitride, silicon oxide, silicon oxynitride, or the like.

The source electrode 140 and the drain electrode 150 may be disposed on or over the interlayer insulating film 135. The source electrode 140 and the drain electrode 150 may be electrically connected to the source area and the drain area of the semiconductor layer 120, respectively, through contact holes formed in the interlayer insulating film 135 and the gate insulating film 125. The source electrode 140 and the drain electrode 150 may be formed of a second metal layer. The second metal layer may include an aluminum alloy. The aluminum alloy may include one of copper (Cu), vanadium (V), and silicon (Si).

In an embodiment of the inventive concept, the second metal layer may include a first layer, a second layer, and a third layer which are sequentially laminated. For example, the first layer may be disposed on or over the bottom surface of the second layer, and the third layer may be disposed on or over the top surface of the second layer. The first layer, the second layer, and the third layer may have a Ti/Al/Ti laminated structure including titanium (Ti), an aluminum alloy, and titanium, respectively.

The storage capacitor CST includes a first storage electrode 133 formed of the same first metal layer as the gate electrode 130, and a second storage electrode 153 formed of the same second metal layer as the source and drain electrodes 140 and 150. The second storage electrode 153 overlaps the first storage electrode 133, in which the storage capacitor CST may be defined in the overlapping area between the first and second storage electrodes 133 and 153.

A planarization layer 175 may be disposed on or over the interlayer insulating film 135 to have a large thickness for covering the source electrode 140, the drain electrode 150, and the second storage electrode 153. The planarization layer 175 may include an organic material such as an acrylic resin, an epoxy resin, a polyimide resin, or a polyester resin.

A first electrode 180 may be disposed on or over the planarization layer 175. The first electrode 180 may be electrically connected to the drain electrode 150 of the thin film transistor TFT through a contact hole formed in the planarization layer 175. The first electrode 180 may include indium tin oxide (ITO), silver, and ITO.

A pixel defining layer 190 covering the first electrode 180 may be disposed on or over the planarization layer 175. The pixel defining layer 190 may include an opening exposing the top surface of the first electrode 180, and define a light emitting area. The pixel defining layer 190 may include an organic material such as an acrylic resin, an epoxy resin, a polyimide resin, or a polyester resin.

An organic light emitting layer 210 may be disposed in an opening exposing the top surface of the first electrode 180. The organic light emitting layer 210 may include a low molecular organic compound or a high molecular organic compound. In an embodiment of the inventive concept, the organic light emitting layer 210 may emit red light, green light, or blue light. In an embodiment of the inventive concept, when the organic light emitting layer 210 emits white light, the organic light emitting layer 210 may include a multi-layer structure including a red light emitting layer, a green light emitting layer, and a blue light emitting layer, or include a single-layer structure including a red light emitting material, a green light emitting material, and a blue light emitting material.

A second electrode 230 may be disposed on or over the organic light emitting layer 210. For example, the second electrode 230 may be disposed on or over the organic light emitting layer 210 and the pixel defining layer 190. The second electrode 230 may include lithium (Li), calcium (Ca), lithium fluoride (LiF), aluminum (Al), magnesium (Mg), or a combination thereof.

Referring to the display cell of the cut-off area CA, the buffer layer 115 may be arranged on or over the substrate 110.

The gate insulating film 125 may be disposed on or over the buffer layer 115. The first power supply voltage line VL1 and the second power supply voltage line VL2 formed of the first metal layer may be disposed on or over the gate insulating film 125.

In the cut-off area CA, the first power supply voltage line VL1 may include at least one slit pattern SP, and include a plurality of sublines VL_S1 and VL_S2. In addition, the second power supply voltage line VL2 may include at least one slit pattern SP, and include a plurality of sublines VL_S1 and VL_S2. The at least one slit pattern SP and the sublines VL_S1 and VL_S2 may be formed in the process of patterning the first metal layer.

In the cut-off area CA, the interlayer insulating film 135 exposes the sublines VL_S1 and VL_S2 and the at least one slit pattern SP of the first power supply voltage line VL1. The interlayer insulating film 135 may be formed of an inorganic material. The interlayer insulating film 135 formed on or over the sublines VL_S1 and VL_S2 and the at least one slit pattern SP may be removed in a subsequent process for forming a gate pad. However, the inventive concept is not limited thereto, and the interlayer insulating film 135 formed on or over the sublines VL_S1 and VL_S2 and the at least one slit pattern SP may be removed by various subsequent etching processes.

In addition, in the cut-off area CA, the planarization layer 175 exposes the sublines VL_S1 and VL_S2 and the at least one slit pattern SP of the first power supply voltage line VL1. The planarization layer 175 may be formed of an organic material. The planarization layer 175 formed over the sublines VL_S1 and VL_S2 and the at least one slit pattern SP may be removed in the process of forming a via hole, e.g., the contact hole in which the first electrode 180 of the pixel area PXA comes into contact with the drain electrode 150. However, the inventive concept is not limited thereto, and the planarization layer 175 formed on or over the sublines VL_S1 and VL_S2 and the at least one slit pattern SP may be removed by various subsequent etching processes.

The sublines VL_S1 and VL_S2 and the at least one slit pattern SP corresponding to the first power supply voltage line VL1 of the cut-off area CA may be exposed to the outside in the laser cutting process.

In addition, the interlayer insulating film 135 and the planarization layer 175 may expose the sublines VL_S1 and VL_S2 and the at least one slit pattern SP of the second power supply voltage line VL2.

The sublines VL_S1 and VL_S2 and the at least one slit pattern SP corresponding to the second power supply voltage line VL2 of the cut-off area CA may be exposed to the outside in the laser cutting process.

The sublines and the slit pattern are exposed in the laser cutting process, so that faults and defects such as cracks due to the lack of laser processing can be prevented.

In addition, the power supply voltage line of the cut-off area CA is formed into the sublines including the at least one slit pattern, so that faults and defects such as cracks due to incomplete laser processing can be prevented during the laser cutting process.

In an embodiment of the inventive concept, although the first power supply voltage line VL1 and the second power supply voltage line VL2 are illustrated as being formed of the first metal layer in the cut-off area CA, it is not limited thereto, and the first and second power supply voltage lines VL1 and VL2 may be formed of another metal material, which has an excellent resistivity characteristic, used during the process of manufacturing the display cell.

Figure 7:
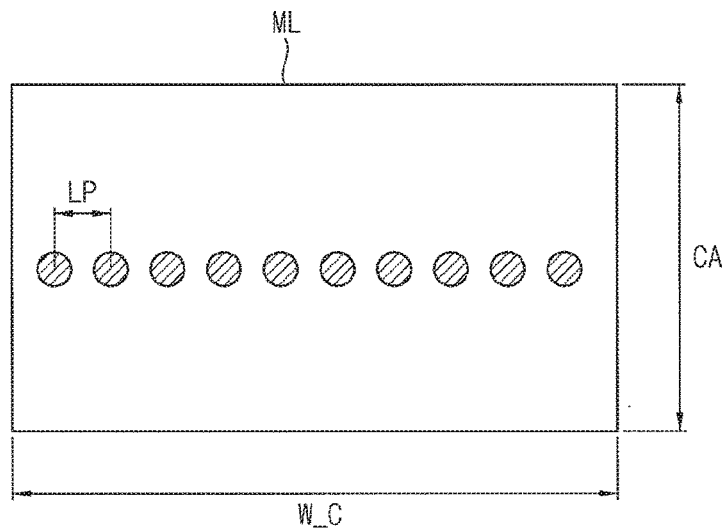
FIGS. 7 and 8 are schematic diagrams for explaining a laser cutting process according to a comparative example and an embodiment of the inventive concept, respectively.
Figure 8:
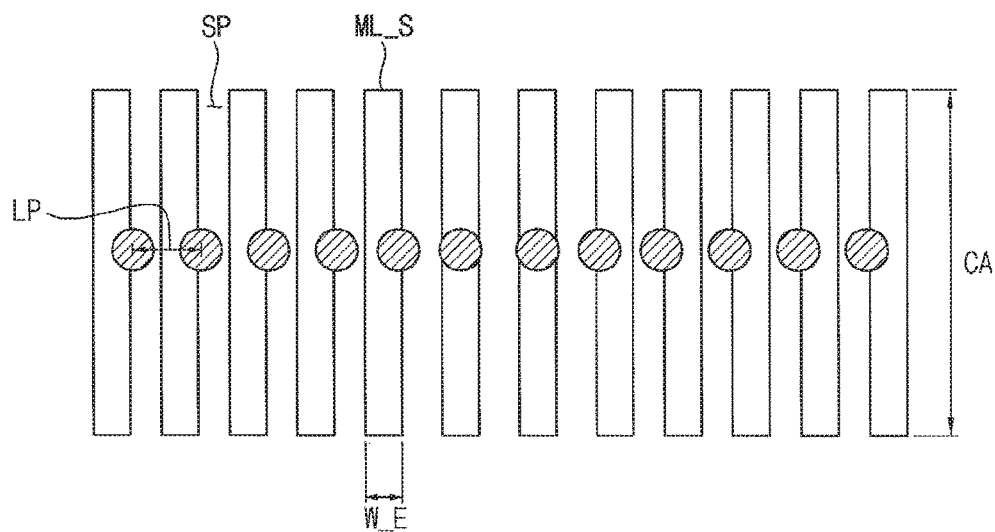

FIGS. 7 and 8 are schematic diagrams for explaining the laser cutting process according to a comparative example and an embodiment of the inventive concept, respectively.

FIG. 7 is a conceptual diagram of a laser processing performed on the cut-off area CA in which a metal line ML having a thick width is disposed according to the comparative example. FIG. 8 is a conceptual diagram of a laser processing performed on a plurality of metal sublines ML_S including a plurality of slit patterns SP according to an embodiment of the inventive concept.

Referring to FIG. 7, when the metal line ML having a width greater than the pitch LP of a plurality of laser spots is disposed in the cut-off area CA according to the comparative example, the laser spot cannot penetrate to the substrate of the display cell due to the metal line and is reflected by the metal line during the laser cutting process, and thus defects such as cracks may occur in the display cell.

Referring to FIG. 8, when the cut-off area CA includes the at least one slit pattern SP having a width greater than or equal to the pitch LP of the laser spot according to an embodiment of the inventive concept, and the metal sublines ML_S having a width W_E greater than or equal to the pitch LP of the laser spot are disposed, the laser may easily penetrate to the substrate of the display cell through the slit pattern during the laser cutting process, and the laser is prevented from reflecting on the metal sublines ML_S, so that defects such as cracks can be prevented.

Figure 9A:
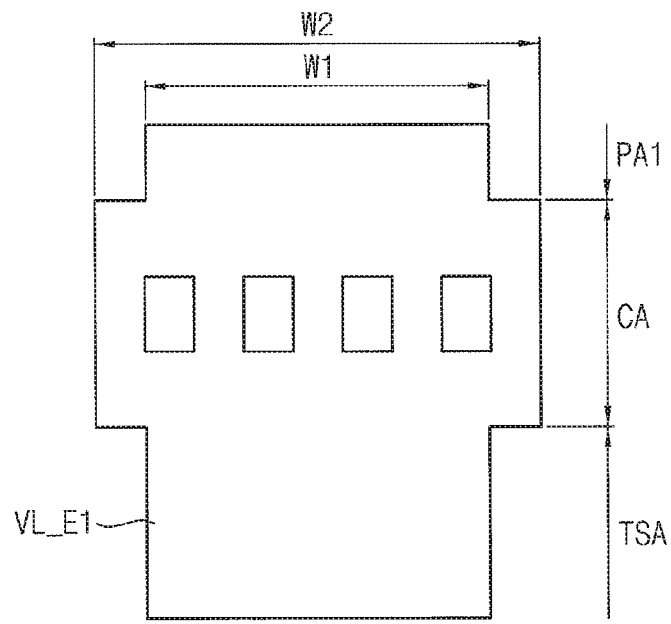
FIGS. 9A and 9B are conceptual diagrams describing various voltage lines according to some embodiments of the inventive concept.
Figure 9B:
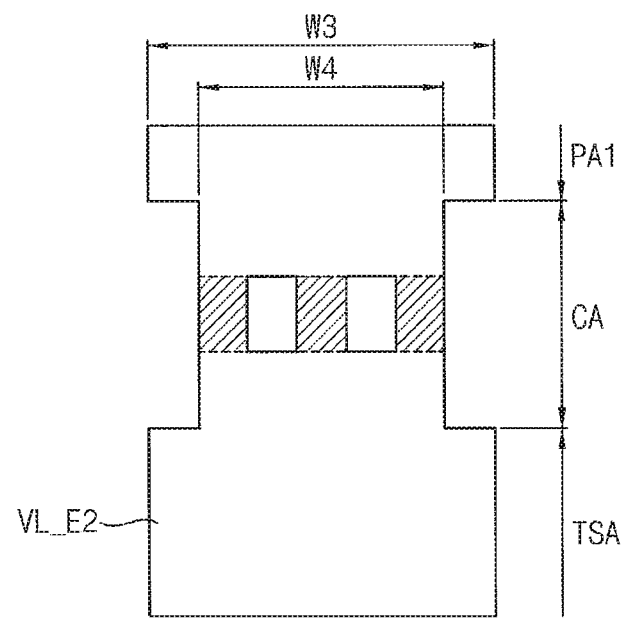

FIGS. 9A and 9B are conceptual diagrams describing various voltage lines according to some embodiments of the inventive concept.

In an embodiment of the inventive concept, referring to FIG. 9A, a power supply voltage line VL_E1 may be formed of the same metal layer as that in the cut-off area CA and adjacent areas TSA and PA1 (e.g., the turn-on inspection area TSA and the first peripheral area PA1) adjacent to the cut-off area CA.

The power supply voltage line VL_E1 includes a plurality of sublines in the cut-off area CA, and includes a plurality of slit patterns between the sublines.

Due to the same resistivity characteristic, the power supply voltage line VL_E1 may have a first width W1 in the adjacent areas TSA and PA1, and have a second width W2 greater than the first width W1 by the widths of the slits in the cut-off area CA.

In an embodiment of the inventive concept, referring to FIG. 9B, a power supply voltage line VL_E2 may be formed of a metal layer different from the cut-off area CA and the adjacent areas TSA and PA1 adjacent to the cut-off area CA.

The power supply voltage line VL_E2 includes a plurality of sublines in the cut-off area CA, and includes a plurality of slit patterns between the sublines.

The power supply voltage line VL_E2 may be formed of a metal layer having a relatively low resistivity characteristic in the adjacent areas TSA and PA1, and formed of a metal layer having a relatively high resistivity characteristic in the cut-off area CA.

Accordingly, the power supply voltage line VL_E2 may have a third width W3 in the adjacent areas TSA and PA1 on the basis of the resistivity characteristic, and have a fourth width W4 smaller than the third width W3 in the cut-off area CA.

For example, when the resistivity of the power supply voltage line VL_E2 in the adjacent areas TSA and PA1 is substantially the same as the resistivity of the power supply voltage line VL_E1 described in FIG. 9A, and the power supply voltage line VL_E2 has the relatively high resistivity characteristic in the cut-off area CA, the number of sublines of the power supply voltage line VL_E2 may be smaller than the number of sublines of the power supply voltage line VL_E1 shown in FIG. 9A.

As described above, the number and width of the metal sublines may be variously determined on the basis of the resistivity of the metal sublines formed in the cut-off area.

Figure 10:
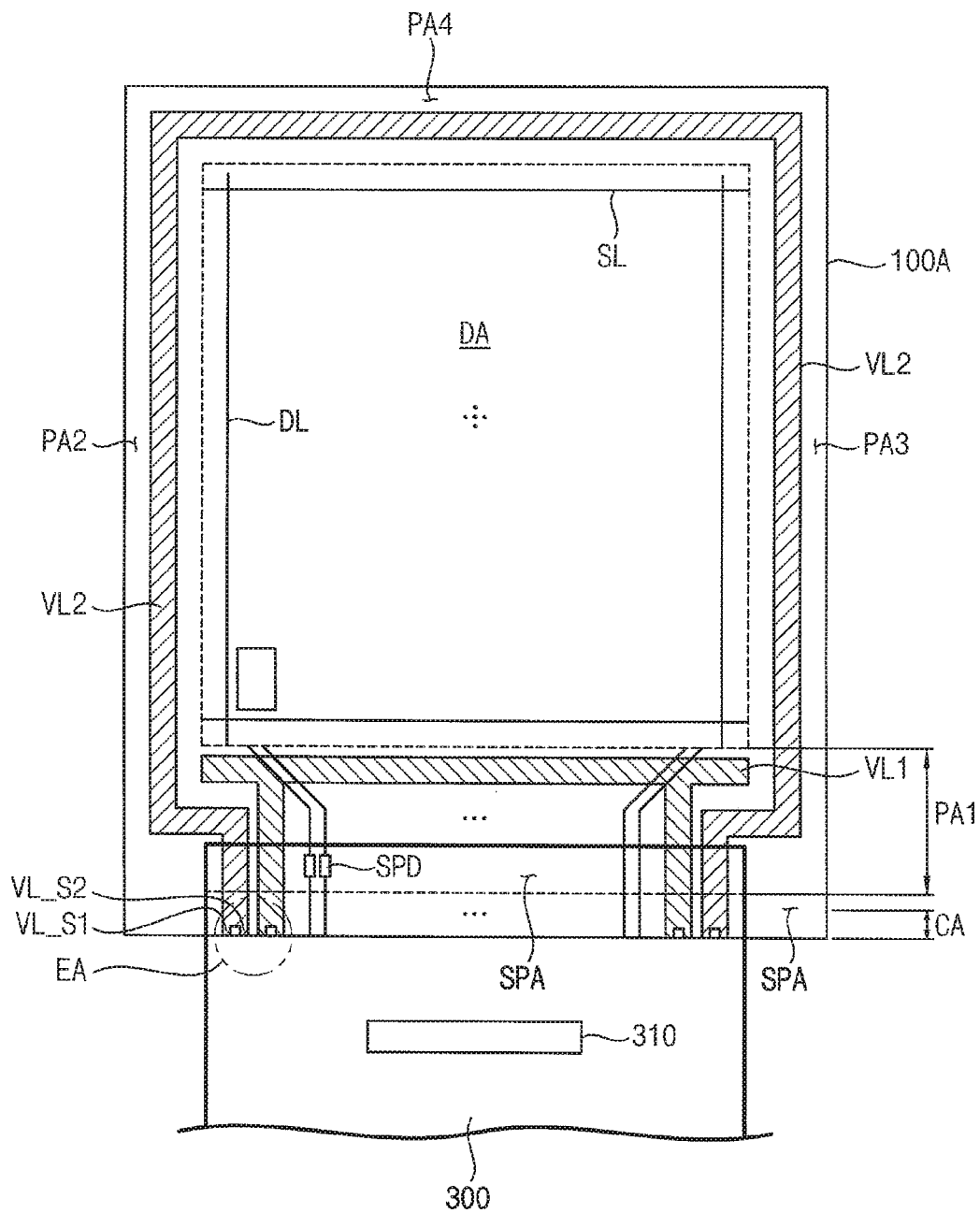
FIG. 10 is a plan view of a display device according to an embodiment of the inventive concept.

FIG. 10 is a plan view of a display device according to an embodiment of the inventive concept.

Referring to FIG. 10, the display device may include a display cell 100A and a flexible circuit board 300.

The display cell 100A has a state where the turn-on inspection area TSA is cut off after the laser cutting process is completed with respect to the display cell 100 shown in FIG. 1. Like the display cell 100 of FIG. 1, the display cell 100A may include the display area DA and the first, second, third, and fourth peripheral areas PA1, PA2, PA3, and PA4 surrounding the display area DA.

As for the display cell 100A, the turn-on inspection area TSA included in the display cell 100 of FIG. 1 may be removed, and a part of the cut-off area CA may be removed.

A part of the cut-off area CA of FIG. 1 may remain in an edge area EA adjacent to the first peripheral area PA1 of the display cell 100A.

In the cut-off area CA of FIG. 1, the first power supply voltage line VL1 and the second power supply voltage line VL2 include a plurality of sublines including at least one slit pattern. Correspondingly, at least one of the first power supply voltage line VL1 and the second power supply voltage line VL2 may include a plurality of sublines VL_S1 and VL_S2 in the edge area EA of the display cell 100A.

The flexible circuit board 300 may be bonded to the signal pad unit SPD having a plurality of signal pads disposed in the signal pad area SPA of the first peripheral area PA1 by using an anisotropic conductive film. The flexible circuit board 300 may be mounted thereon with a driving integrated circuit 310 for driving the display cell 100A.

After the laser cutting process, the display cell 100A may adhere to the flexible circuit board 300 through a module process.

In addition, at least one polarizing plate, a protective film, and the like may be adhered to the display cell 100A through the module process.

According to some embodiments of the inventive concept as described above, the metal line is formed to include a plurality of sublines separated by at least one slit pattern in the cut-off area of the display cell, so that the faults and defects due to the lack of laser processing of the metal line can be prevented. In addition, the organic and inorganic insulating films on or over the at least one slit pattern and the sublines are removed in the cut-off area to expose the at least one slit pattern and the sublines, so that the faults and defects due to incomplete laser processing can be prevented.

The inventive concept may be applied to any electronic device including a display device. For example, the inventive concepts may be applied to a smart phone, a tablet computer, a mobile phone, a personal computer (PC), a home appliance, a laptop computer, etc.

While the inventive concept has been shown and described with reference to some embodiments thereof, it will be apparent to those of ordinary skill in the art that various changes in form and details may be made thereto without departing from the spirit and scope of the inventive concept as set forth by the appended claims.

What is claimed is:

1. A display cell comprising:
    a signal line electrically connected to a pixel arranged in a display area;
    a signal pad unit disposed in a peripheral area adjacent to the display area, and including a signal pad electrically connected to the signal line;
    an inspection pad unit disposed in a turn-on inspection area, and including an inspection pad electrically connected to the signal pad, wherein the inspection pad is configured to receive a turn-on inspection signal; and
    a power supply voltage line electrically connected to the inspection pad and configured to apply a power supply voltage to the pixel, extending from the inspection pad unit to the peripheral area, and divided into a plurality of sublines by at least one slit pattern in a cut-off area between the peripheral area and the turn-on inspection area.

2. The display cell of claim 1, further comprising:
    an insulating film exposing the at least one slit pattern and the plurality of sublines in the cut-off area.

3. The display cell of claim 2, wherein the insulating film includes;
    an inorganic insulating film disposed over a gate electrode of a transistor included in the pixel; and
    an organic insulating film disposed over a source electrode and a drain electrode of the transistor.

4. The display cell of claim 1, wherein the at least one slit pattern has a width corresponding to an extending direction of a cutting line and a length corresponding to a direction intersecting the extending direction.

5. The display cell of claim 4, wherein the width of the at least one slit pattern is greater than a pitch of a laser spot used during a cutting process.

6. The display cell of claim 5, wherein the plurality of sublines have a line width corresponding to the extending direction of the cutting line, and the line width is greater than the pitch of the laser spot.

7. The display cell of claim 4, wherein a width of the power supply voltage line in the cut-off area is determined according to a resistivity characteristic of the plurality of sublines.

8. The display cell of claim 1, further comprising:
    a turn-on inspection circuit disposed in the turn-on inspection area and electrically connected to the inspection pad unit.

9. The display cell of claim 1, wherein the pixel includes an organic light emitting diode, and
    wherein the power supply voltage line includes at least one of a first power supply voltage line configured to transmit a first power supply voltage to the organic light emitting diode, and a second power supply voltage line configured to transmit a second power supply voltage to the organic light emitting diode.

10. The display cell of claim 9, wherein the peripheral area includes a first peripheral area in which the signal pad unit is disposed, a second peripheral area adjacent to the first peripheral area, a third peripheral area facing the second peripheral area, and a fourth peripheral area facing the first peripheral area, wherein the first to fourth peripheral areas surround the display area, and wherein the first power supply voltage line extends from the inspection pad unit and is disposed in the first peripheral area.

11. The display cell of claim 10, wherein the second power supply voltage line extends from the inspection pad unit and is disposed in the second, third, and fourth peripheral areas.

12. A display device comprising:
a display cell including a signal line electrically connected to, a pixel arranged in a display area, a signal pad unit disposed in a peripheral area adjacent to the display area and including a signal pad electrically connected to the signal line, an inspection pad unit including an inspection pad electrically connected to the signal pad, and a power supply voltage line disposed in the peripheral area, electrically connected to the inspection pad and configured to apply a power supply voltage to the pixel and divided into a plurality of sublines in an edge area; and
a flexible circuit board bonded to the signal pad unit through an anisotropic conductive film, wherein a driving integrated circuit configured to drive the display cell is mounted over the flexible circuit board.

13. The display device of claim 12, wherein the display cell further includes an insulating film exposing the plurality of sublines disposed in the edge area.

14. The display device of claim 13, wherein the insulating film includes;
an inorganic insulating film disposed over a gate electrode of a transistor included in the pixel; and
an organic insulating film disposed over a source electrode and a drain electrode of the transistor.

15. The display device of claim 12, wherein the pixel includes an organic light emitting diode, and
wherein the power supply voltage line includes at least one of a first power supply voltage line configured to transmit a first power supply voltage to the organic light emitting diode, and a second power supply voltage line configured to transmit a second power supply voltage to the organic light emitting diode.

16. The display device of claim 15, wherein the peripheral area includes a first peripheral area in which the signal pad unit is disposed, a second peripheral area adjacent to the first peripheral area, a third peripheral area facing the second peripheral area, and a fourth peripheral area facing the first peripheral area, wherein the first to fourth peripheral areas surround the display area, and wherein the first power supply voltage line extends from the edge area and is disposed in the first peripheral area.

17. The display device of claim 16, wherein the second power supply voltage line extends from the edge area and is disposed in the second, third, and fourth peripheral areas.

18. A method of manufacturing a display cell, the method comprising:
forming a signal line electrically connected to a pixel arranged in a display area;
forming a signal pad disposed in a peripheral area adjacent to the display area and electrically connected to the signal line;
forming an inspection pad disposed in a turn-on inspection area, and electrically connected to the signal pad such that a turn-on inspection signal is applied to the inspection pad; and
forming, a power supply voltage line that is electrically connected to and extending from the inspection pad to the peripheral area, and divided into a plurality of sublines by at least one slit pattern in a cut-off area between the peripheral area and the turn-on inspection area.

19. The method of claim 18, further comprising:
exposing the at least one slit pattern and the plurality of sublines by removing an insulating film disposed over the at least one slit pattern and the plurality of sublines in the cut-off area.

20. The method of claim 18, wherein the at least one slit pattern has a width of a slit pattern corresponding to an extending direction of a cutting line, the width of the slit pattern is greater than a pitch of a laser spot used in a cutting process, the plurality of sublines have a line width corresponding to the extending direction of the cutting line, and the line width is greater than the pitch of the laser spot.

* * * * *